US010950795B2

(12) United States Patent
Richter et al.

(10) Patent No.: US 10,950,795 B2
(45) Date of Patent: Mar. 16, 2021

(54) FULLERENE DERIVATIVE BLENDS, METHODS OF MAKING AND USES THEREOF

(71) Applicant: Nano-C, Inc., Westwood, MA (US)

(72) Inventors: Henning Richter, Newton, MA (US); Edward A. Jackson, Franklin, MA (US)

(73) Assignee: Nano-C, Inc., Westwood, MA (US)

( * ) Notice: Subject to any disclaimer, the term of this patent is extended or adjusted under 35 U.S.C. 154(b) by 0 days.

(21) Appl. No.: 16/717,711

(22) Filed: Dec. 17, 2019

(65) Prior Publication Data

US 2020/0194677 A1  Jun. 18, 2020

Related U.S. Application Data

(60) Provisional application No. 62/780,569, filed on Dec. 17, 2018.

(51) Int. Cl.
| | | |
|---|---|---|
| *H01B 1/04* | (2006.01) | |
| *H01L 51/00* | (2006.01) | |
| *C08K 3/04* | (2006.01) | |
| *C08K 9/04* | (2006.01) | |
| *H01L 51/42* | (2006.01) | |
| *B82Y 30/00* | (2011.01) | |
| *B82Y 40/00* | (2011.01) | |

(52) U.S. Cl.
CPC .......... *H01L 51/0047* (2013.01); *C08K 3/045* (2017.05); *C08K 9/04* (2013.01); *H01B 1/04* (2013.01); *B82Y 30/00* (2013.01); *B82Y 40/00* (2013.01); *C08K 2201/011* (2013.01); *H01L 51/4213* (2013.01)

(58) Field of Classification Search
CPC .... H01B 1/00; H01B 1/04; H01B 1/24; H01L 51/00; H01L 51/0036; H01L 51/0043; H01L 51/4253; H01L 51/46
See application file for complete search history.

(56) References Cited

U.S. PATENT DOCUMENTS

| | | | |
|---|---|---|---|
| 7,906,797 B2 | 3/2011 | Hummelen et al. | |
| 8,435,713 B2 | 5/2013 | Kronholm et al. | |
| 8,481,996 B2 | 7/2013 | Hummelen et al. | |
| 9,502,658 B2 * | 11/2016 | Jackson | H01B 1/04 |
| 9,527,797 B1 | 12/2016 | Jackson et al. | |
| 2005/0239717 A1 | 10/2005 | Kronholm et al. | |
| 2010/0127244 A1 * | 5/2010 | Kronholm | H01L 51/0047 257/40 |

(Continued)

FOREIGN PATENT DOCUMENTS

| | | |
|---|---|---|
| EP | 3343656 A1 * | 7/2018 |
| WO | WO 2009/039490 A2 * | 3/2009 |
| WO | WO-2015192942 | 12/2015 |

OTHER PUBLICATIONS

Nagata et al "Kilogram-scale [60] fullerene separation from a fullerene mixture . . . ", Chemistry Letters, vol. 34, No. 2, 2005, pp. 178-179.*

(Continued)

*Primary Examiner* — Mark Kopec
(74) *Attorney, Agent, or Firm* — Wilmer Cutler Pickering Hale and Dorr LLP (57) ABSTRACT

Fullerene derivative blends are described herein. The blends are useful in electronic applications such as, e.g., organic photovoltaic devices.

25 Claims, 5 Drawing Sheets

(56) References Cited

U.S. PATENT DOCUMENTS

| | | | |
|---|---|---|---|
| 2012/0043507 | A1 | 2/2012 | Kronholm et al. |
| 2013/0306944 | A1 | 11/2013 | Kronholm et al. |
| 2014/0312281 | A1 | 10/2014 | Jackson et al. |
| 2016/0268531 | A1 | 9/2016 | Huang et al. |
| 2017/0092866 | A1 | 3/2017 | Blouin et al. |
| 2017/0267628 | A1 | 9/2017 | Jackson et al. |
| 2017/0294585 | A1* | 10/2017 | Morse .................. C07C 13/62 |

OTHER PUBLICATIONS

Cataldo et al "Characterization of hydrogenated fullerene mixture of C60Hx and C70Hx", Fullerenes, Nanotubes and Carbon Nanostructures, vol. 18, Issue 2, 2010 (Abstract).*
Bakhramov et al "Characterization of fullerene C60/70 molecules in solutions and its influence on the optical and the nonlinear optical properties of solutions", Journal of the Korean Physical Society, vol. 64, No. 10, May 2014, pp. 1494-1499.*
Baran, D. et al., "Reducing the efficiency-stability-cost gap of organic photovoltaics with highly efficient and stable small molecule acceptor ternary solar cells", Nature Materials, 16:363-370, 2017, published online Nov. 21, 2016 (8 pages).
Chen, C-P. et al., "Open-Cage Fullerenes as n-Type Materials in Organic Photovoltaics: Relevance of Frontier Energy Levels, Carrier Mobility and Morphology of Different Sizable Open-Cage Fullerenes with Power Conversion Efficiency in Devices", Advanced Energy Materials, 1(5):776-780, Supporting Information, Aug. 4, 2011 (23 pages).
Cowan, S.R. et al., "Identifying a Threshold Impurity Level of Organic Solar Cells: Enhanced First-Order Recombination Via Well-Defined $PC_{84}BM$ Traps in Organic Bulk Heterojunction Solar Cells", Advanced Functional Materials, 21:3083-3092, 2011 (10 pages).
Holliday, S. et al., "High-efficiency and air-stable P3HT-based polymer solar cells with a new non-fullerene acceptor", Nature Communications, 7:11585, DOI: 10.1038/NCOMMS11585, www.nature.com/naturecommunications, published Jun. 9, 2016 (11 pages).
International Search Report and Written Opinion issued by the U.S. Patent and Trademark Office as International Searching Authority in International Application No. PCT/US19/66879, dated Mar. 2, 2020 (11 page).
Lenes, M. et al., "Electron Trapping in Higher Adduct Fullerene-Based Solar Cells", Advanced Functional Materials, 19:3002-3007, 2009 (6 pages).
Lin, R. et al., "Enhancement of ternary blend organic solar cell efficiency using PTB7 as a sensitizer", Synthetic Metals, 192:113-118, available online Apr. 9, 2014 (6 pages).
Liu, Z. et al., "High-Efficiency Hybrid Solar Cells Based on Polymer/$PbS_xSe_{1-x}$ Nanocrystals Benefiting from Vertical Phase Segregation", Advanced Materials, 25:5772-5778, Supporting Information, Aug. 12, 2013 (17 pages).
Ross, R. et al., "Endohedral fullerenes for organic photovoltaic devices", Nature Materials, 208-212, Mar. 2009 (5 pages).
Wienk, M. et al., "Efficient Methano[70]fullerene/MDMO-PPV Bulk Heterojunction Photovoltaic Cells", Agnew. Chem. Int. Ed., 42:3371-3375, 2003 (5 pages).
Yang, Y., et al., "Reversible Fullerene Electrochemistry: Correlation with the HOMO-LUMO Energy Difference for $C_{60}$, $C_{70}$, $C_{76}$, $C_{78}$, and $C_{84}$", Journal of the American Chemical Society, 117(29):7801-7804, Jul. 1, 1995 (4 pages).

* cited by examiner

FULLERENE DERIVATIVE BLENDS, METHODS OF MAKING AND USES THEREOF

This patent application claims the benefit of the earlier filing date of U.S. Patent Application No. 62/780,569, filed on Dec. 17, 2018, the contents of which are incorporated by reference herein in its entirety.

INCORPORATION BY REFERENCE

All publications, patent applications, patents, and other references mentioned herein are incorporated by reference in their entirety. The patent and scientific literature referred to herein establishes knowledge that is available to those skilled in the art. The issued patents, applications, and other publications that are cited herein are hereby incorporated by reference to the same extent as if each was specifically and individually indicated to be incorporated by reference. In the case of inconsistencies, the present disclosure will prevail.

FIELD OF THE INVENTION

The instant application relates generally to materials. More particularly, the instant application relates to fullerene blends and photovoltaic devices comprising fullerene blends.

BACKGROUND

Organic photovoltaic devices (OPVs) based on liquid processed bulk heterojunction have significant potential to be used for an increasing number of applications where low weight, flexibility or the capability to generate power at a limited level of irradiation (e.g., for indoor energy harvesting) are required. However, the wide-spread implementation prefers a sufficiently high-power conversion efficiency (PCE) that remains largely stable during the lifetime of the device. Over the last years, the development of new classes of low-band-gap polymers allowing a more efficient absorption of the solar light resulting in the efficient formation of excitons followed by charge transport to the electrodes has made significant progress. However, while the initial PCE of devices using such polymers as electron-donor materials has increased significantly in many cases, stability, as assessed, for instance, by means of light soaking experiments, was often disappointing.

SUMMARY

In one aspect of the invention, a composition is provided comprising a first fullerene derivative and a second fullerene derivative; wherein the first and second fullerene derivative are of different types; and wherein the ratio of the first fullerene derivative to the second fullerene derivative is between about 97:3 and about 60:40.

In some embodiments, the first fullerene derivative is a methanofullerene.

In some embodiments, the first fullerene is a Diels-Alder adduct.

In some embodiments, the second fullerene derivative is a Diels-Alder adduct.

In some embodiments, the second fullerene derivative is a methanofullerene.

In some embodiments, the first fullerene derivative is a Diels-Alder adduct and the second fullerene derivative is a methanofullerene.

In some embodiments, the first fullerene derivative is a methanofullerene and the second fullerene derivative is a Diels-Alder adduct.

In some embodiments, the first fullerene derivative is a $C_{60}$-based fullerene derivative and the second fullerene derivative is a $C_{70}$-based fullerene derivative.

In some embodiments, the first fullerene derivative is a $C_{70}$-based fullerene derivative and the second fullerene derivative is a $C_{60}$-based fullerene derivative.

In some embodiments, the first fullerene derivative and the second fullerene derivative are $C_{60}$-based fullerene derivatives.

In some embodiments, the first fullerene derivative and the second fullerene derivative are $C_{70}$-based fullerene derivatives.

In some embodiments, the ratio of the first fullerene derivative and the second fullerene derivative is between about 97:3 and about 70:30.

In some embodiments, the ratio of the first fullerene derivative and the second fullerene derivative is between about 95:5 and about 70:30.

In some embodiments, the ratio of the first fullerene derivative and the second fullerene derivative is between about 92:8 and about 70:30.

In some embodiments, the ratio of the first fullerene derivative and the second fullerene derivative is between about 97:3 and about 75:25.

In some embodiments, the ratio of the first fullerene derivative and the second fullerene derivative is about 95:5.

In some embodiments, the ratio of the first fullerene derivative and the second fullerene derivative is about 90:10.

In some embodiments, the ratio of the first fullerene derivative and the second fullerene derivative is about 85:15.

In some embodiments, the ratio of the first fullerene derivative and the second fullerene derivative is about 75:25.

In some embodiments, the composition further comprises a third fullerene derivative.

In some embodiments, the composition further comprises a non-fullerene material serving as electron acceptor.

In some embodiments, the non-fullerene material comprises a quantum dot.

In some embodiments, the non-fullerene material emits photons after light absorption. The emitted photons may be absorbed in the active layer, e.g., by the donor material, and form excitons thereby generating additional charge transport.

In some embodiments, the methanofullerene is selected from the group consisting of phenyl-$C_{61}$-butyric-acid-methyl-ester ([60]PCBM), thiophenyl-$C_{61}$-butyric-acid-methyl-ester ([60]ThCBM), [70]PCBM, phenyl-$C_{61}$-butyric-acid-hexyl-ester ([60]PCBC$_6$), phenyl-$C_{71}$-butyric-acid-hexyl-ester ([70]PCBC$_6$) and other [6,6]-phenyl $C_{61}$ butyric acid or [6,6]-phenyl $C_{71}$ butyric acid derivatives.

In some embodiments, the Diels-Alder adduct is selected from the group consisting of optionally substituted indene, n-hexyl-esters, a-substituted o-quinodimethane, and esters of 3-(1-indenyl) propionic acid.

In some embodiments, the first fullerene derivative is [60]PCBM or [70]PCBM, and the second fullerene derivative is a Diels-Alder indene-adduct, α-substituted o-quinodimethane-adduct, or ester of 3-(1-indenyl) propionic acid.

In some embodiments, the first fullerene derivative is [60]PCBM, and the second fullerene derivative is In some embodiments, the composition further comprises a semiconducting polymer.

In some embodiments, the semiconducting polymer is selected from the group consisting of poly(3-hexylthiophene), (poly[2-(3,7-dimethyloctyloxy)-5-methyloxy]-para-phenylene vinylene) (MDMO-PPV), carbazole-based copolymers, diketopyrrolopyrrole (DPP)-based copolymers, cyclopentadithiophene-based copolymers, and small molecules including some liquid crystals (e.g., functionalized hexabenzoncoronene), pentacene derivatives, oligothiophenes, triphenylamines, functionalized anthradithiophenes and a number of traditional low molecular weight colorants, e.g., from the thiophene- and indoline series.

In a second aspect of the invention, an organic photovoltaic device is provided comprising a composition comprising a first fullerene derivative and a second fullerene derivative; wherein the first and second fullerene derivative are of different types; and wherein the ratio of the first fullerene derivative to the second fullerene derivative is between about 97:3 and about 60:40.

In some embodiments, the device has increased stability relative to OPV devices that are not comprised of two fullerene derivatives. In some embodiments, the device has increased stability relative to OPV devices that are not comprised of two fullerene derivatives of different types.

In some embodiments, the device has increased thermal stability when heated under air to 120° C. relative to OPV devices that are not comprised of two fullerene derivatives.

In some embodiments, the device has increased stability when submitted to irradiation of 1 sun intensity relative OPV devices that are not comprised of two fullerene derivatives.

DETAILED DESCRIPTION

The initial PCE of devices using low-band-gap polymers as electron-donor materials has increased; however, stability, as assessed, e.g., by light soaking experiments, was often disappointing. Strategies to eliminate or at least minimize the decrease of the PCE over time (which is usually driven by a decrease of the short circuit current, $J_{sc}$) include the use of $C_{70}$ derivatives as electron acceptor material. However, the use of $C_{70}$-derivative at an industrial level, is, at least at the current stage, economically not viable, taking into account the approximately 10-fold higher price of $C_{70}$-derivatives in comparison to $C_{60}$ derivatives. In addition, some blends of electron acceptor materials have been reported to reduce performance significantly due to the presence of electron traps (Lenes et al., *Adv. Funct. Mater.* 2009, 19, 3002-3007; Cowan et al., *Adv. Funct. Mater.* 2011, 21, 3083-3092; each herein incorporated by reference in its entirety). Differences in functionalization of blended acceptors can lead to different electronic structures, particularly LUMO levels, creating electronic traps and lowering overall performance. Differences in functionalization can lead to undesirable morphology which may decrease the stability of a device. Differences in functionalization may leave an undesirable morphology unimproved so that a disappointing stability of a device is maintained. Well-performing devices with increased stability using blends are unexpected.

Organic photovoltaic devices, methods of making and uses thereof are described herein. The devices comprise fullerene derivatives as electron-acceptor materials.

In one aspect of the invention blends of electron-acceptor materials are used in devices based on a bulk heterojunction (BHJ) in which at least two electron acceptors are fullerene derivatives of different types, i.e., not bearing the same adduct groups. Using such blends in a suitable ratio of the two components does not only lead to a similar initial PCE as a BHJ with the same low band gap electron donor polymer and a pure [60]PCBM or [70]PCBM as electron acceptor material. This blend also allows for significantly increased stability under light soaking conditions, which is desirable for organic photovoltaic (OPV) devices.

In the past, compositions of pure fullerenes or fullerene derivatives were preferred for OPV applications. $C_{60}$ and $C_{70}$ fullerenes have different electronic structures, including different LUMO levels (Yang et al., *J. Am. Chem. Soc.* 1995, 117, 7801-7804; herein incorporated by reference in its entirety). Similarly, fullerene derivatives of different types have different electronic structures. Fullerene blends were undesirable because these different electronic structures lead to energy traps that trap electrons and contribute to recombination of electron hole pairs. Recombination of electron hole pairs limits the short-circuit current. Additionally, blends of fullerene derivatives increase disorder of polymer-acceptor blends, which may additionally decrease electron mobility and energy conversion efficiency. Surprisingly, blends with suitable ratios of fullerene derivatives of different types can have an initial PCE similar to or greater than compositions of pure fullerenes while also having increased stability.

Fullerene Derivatives

Fullerene derivatives include, e.g., methanofullerenes, Prato fullerene derivatives, Bingel fullerene derivatives, diazoline fullerene derivatives, azafulleroid, ketolactams, and Diels-Alder fullerene derivatives. Fullerene derivatives can bear one or more functional groups. In the case of multiple functionalization (usually 2 or 3), the functional groups can be identical or different. Fullerene derivatives are disclosed, for example, in International Patent Publication WO 2015/192942, U.S. Patent Publication No. 2013/0306944, U.S. Patent Publication No. 2017/0294585, U.S. Pat. Nos. 8,435,713, and 9,527,797 (each herein incorporated by reference in its entirety). Other fullerene derivatives include endohedral fullerene derivatives and open cage fullerenes. Examples are described (but not limited to those) in Ross et al. (*Nature Materials* 2009, 8, 208-212, endohedrals) and Chen et al. (*Adv. Energy Mater.* 2011, 1, 776-780, open cage fullerenes), each herein incorporated by reference in its entirety.

Methanofullerenes have the general form where A is a fullerene; X and Y are independently aryl, alkyl or other groups bonded via diazoalkane addition; and n is an integer between 1 and 6. In some embodiments, X and Y are independently aryl or alkyl; and n is an integer between 1 and 4. In some embodiments, X and Y are independently aryl or alkyl; and n is 1 or 2. In some embodiments, X and Y are independently aryl or alkyl; and n is 1. Non-limiting examples of methanofullerenes include phenyl-$C_{61}$-butyric-acid-methyl-ester ([60]PCBM), thiophenyl-$C_{61}$-butyric-acid-methyl-ester ([60]ThCBM), [70]PCBM, phenyl-$C_{61}$-butyric-acid-hexyl-ester ([60]PCBC$_6$), phenyl-$C_{71}$-butyric-acid-hexyl-ester ([70]PCBC$_6$) and other [6,6]-phenyl $C_{61}$ butyric acid or [6,6]-phenyl $C_{71}$ butyric acid derivatives ($C_{60}$-PCBX or $C_{70}$-PCBX). Methanofullerenes can be prepared, for example, as described in U.S. Pat. No. 8,435,713 and U.S. Patent Publication No. 2005/0239717 (each herein incorporated by reference in its entirety). Methanofullerenes are frequently blended with polymers to serve as electron acceptors in OPV devices. A blend of [60]PCBM and [70]PCBM may be prepared as described in U.S. Patent Publication No. 2017/0294585 (each herein incorporated by reference in its entirety). $C_{70}$-PCBX may be prepared as described in U.S. Patent Publication No. 2017/0267628 (herein incorporated by reference in its entirety).

In some embodiments, the methanofullerene is

In some embodiments, the methanofullerene is

In some embodiments, the methanofullerene is

Prato derivatives have the general form where A is a fullerene; $R_1$ is optionally substituted aryl or aralkyl; and $R_2$, $R_3$, $R_4$, and $R_5$ are independently optionally substituted alkyl, optionally substituted cycloalkyl, optionally substituted heteroalkyl, optionally substituted heterocycloalkyl, optionally substituted alkenyl, or optionally substituted aralkyl. In some embodiments, $R_1$ is optionally substituted aryl or aralkyl; and $R_2$, $R_3$, $R_4$, and $R_5$ are independently optionally substituted alkyl, optionally substituted cycloalkyl, optionally substituted heteroalkyl, optionally substituted heterocycloalkyl, or optionally substituted aralkyl. In some embodiments, $R_1$ is aryl or aralkyl; and $R_2$, $R_3$, $R_4$, and $R_5$ are independently alkyl, cycloalkyl, heteroalkyl, heterocycloalkyl, or aralkyl. Prato derivatives include 2-Aza-Propano-($C_n$+2N). Prato fullerene derivatives may be formed of either $C_{60}$ or $C_{70}$.

Bingel derivatives, a sub-class of methanofullerenes, have the general form where A is a fullerene; X is an electron withdrawing group; Y is a hydrogen, aryl, substituted aryl, alkyl, substituted alkyl; and z is an integer between 1 and 6. Nonlimiting examples of electron withdrawing groups include ester, nitrile, nitro, cyano, ketone, dialkylphosphate, substituted pyridine, trialkylsilyl acetylene, or a trisubstituted silyl group. In some embodiments, z is an integer between 1 and 4. In some embodiments, z is 1 or 2.

Diazoline derivatives have the general form where A is a fullerene; $R_6$ and $R_7$ are independently aryl.

Azafulleroid derivatives have the general form where A is a fulleroid; $R_9$ is an alkyl, aryl, substituted aryl, or $SO_2$—$R_8$, wherein $R_8$ is an alkyl, aryl, or substituted aryl.

Diels-Alder derivatives have the general form or where A is a fullerene; $R_{10}$ and $R_{11}$ are independently H, alkyl, alkyloxy, —OC(O)$R_{12}$, aryl, substituted alkyl, substituted aryl, heteroaryl, or substituted heteroaryl; $R_{12}$ is independently alkyl, alkyloxy, aryl, substituted alkyl, substituted aryl, heteroaryl, or substituted heteroaryl; X is O, alkyl, substituted alkyl, aryl, substituted aryl, heteroaryl, or substituted heteroaryl; Y is aryl, substituted aryl, heteroaryl, substituted heteroaryl, vinylene, or substituted vinylene; and n is an integer from 1-20. Nonlimiting examples of Diels-Alder derivatives include indene-adducts, 2-methoxyindene-$C_{60}$, other alkoxy-substituted indene- and o-quinodimethane-$C_{60}$ and $C_{70}$ adducts, α-substituted o-quinodimethane-adducts, esters of 3-(1-indenyl) propionic acid adducts of $C_{60}$ or $C_{70}$, bis-indene-, and bis-o-quinodimethane-$C_{60}$ and $C_{70}$ adducts.

In some embodiments, the Diels-Alder derivative is or or an ester of 3-(1-indenyl) propionic acid.

R = hexyl, from R = ethyl

In some embodiments, the Diels-Alder derivative is or

In some embodiments, the Diels-Alder derivative is

In some embodiments, the Diels-Alder derivative is

Fullerene Blends

Blends of at least two fullerene derivatives may include two or more $C_{60}$ derivatives, two or more $C_{70}$ derivatives or at least one $C_{60}$ derivative and at least one $C_{70}$ derivative.

Blends of at least two fullerene derivatives may include two or more different types of fullerene derivatives. In some embodiments, each type of fullerene derivative includes a different type of fullerene derivative.

Blends of at least two fullerene derivatives may additionally comprise non-fullerene acceptor materials. Nonlimiting examples of non-fullerene acceptors include indacenodithiophene core flanked with benzothiadiazole and rhodanine groups (IDTBR), indenofluorene analogue of IDTBR (IDFBR), (5Z,50Z)-5,50-{(9,9-dioctyl-9H-fluorene-2,7-diyl)bis[2,1,3-benzothiadiazole-7,4-diyl(Z)methylylidene]} bis(3-ethyl-2-thioxo-1,3-thiazolidin-4-one)(FBR), n-octyl indacenodithiophene (O-IDTBR), 2-ethylhexyl indacenodithiophene (EH-IDTBR) or quantum dots (e.g., Liu et al., Adv. Mater. 2013, 25, 5772-5778; Holliday et al., Nature Communications vol. 7, Article number: 11585 (2016); Baran et al., Nature Materials, 2017, 16, 363-369; each herein incorporated by reference in its entirety.)

Blends of two fullerene derivatives may have ratios of about 97:3, 95:5, 90:10, 85:15, 80:20, 75:25, 70:30, 60:40 or any ratio in between.

Blends of fullerene derivatives may be formed by adding each fullerene derivative in powder form into solution using, e.g, toluene, o-xylene, o-dichlorobenzene, blends of solvents and additives such as but not limited to 1,8-octanedithiol.

The blend may then be deposited from solution. The solution may be added to an antisolvent to aid in precipitation of the blend. The precipitated blend may be filtered and dried in an oven or vacuum, or a combination of oven and vacuum. Other methods will be apparent to those skilled in the art.

In some embodiments, the blend comprises a methanofullerene and a Diels-Alder derivative. The methanofullerene may be $C_{60}$- or $C_{70}$-based. In some embodiments, the methanofullerene may be PCBM. The Diels-Alder derivative may comprise an indene adduct substituted at the α-position.

In some embodiments, the blend comprises between about a 97:3 and 60:40 ratio of methanofullerene:Diels-Alder derivative. In some embodiments, the blend comprises between about a 97:3 and 60:40 ratio of Diels-Alder:methanofullerene derivative. In some embodiments, the blend comprises about a 95:5, 90:10, 85:15, 80:20, 75:25, 70:30, or 60:40 ratio of methanofullerene:Diels-Alder derivative. In some embodiments, the blend comprises about a 95:5, 90:10, 85:15, 80:20, 75:25, 70:30, or 60:40 ratio of Diels-Alder:methanofullerene derivative. In some embodiments, the blend comprises about a 90:10, or 85:15 ratio of methanofullerene:Diels-Alder derivative. In some embodiments, the blend comprises about a 90:10, or 85:15 ratio of Diels-Alder:methanofullerene derivative.

In some embodiments, the blend comprises [60]PCBM and a $C_{60}$-indene adduct (including indene-adducts bearing functional groups at the α- or other positions). In some embodiments, the blend comprises about 95% [60]PCBM and about 5% $C_{60}$-indene adduct. In some embodiments, the blend comprises about 90% [60]PCBM and about 10% $C_{60}$-indene adduct. In some embodiments, the blend comprises about 85% [60]PCBM and about 15% $C_{60}$-indene adduct. In some embodiments, the blend comprises about 5% [60]PCBM and about 95% $C_{60}$-indene adduct. In some embodiments, the blend comprises about 10% [60]PCBM and about 90% $C_{60}$-indene adduct. In some embodiments, blend comprises about 15% [60]PCBM and about 85% $C_{60}$-indene adduct.

In some embodiments, the blend comprises [60]PCBM and a $C_{70}$-indene adduct (including indene-adducts bearing functional groups at the α- or other positions). In some embodiments, the blend comprises about 95% [60]PCBM and about 5% $C_{70}$-indene adduct. In some embodiments, the blend comprises about 90% [60]PCBM and about 10% $C_{70}$-indene adduct. In some embodiments, the blend comprises about 85% [60]PCBM and about 15% $C_{70}$-indene adduct. In some embodiments, the blend comprises about 5% [60]PCBM and about 95% $C_{70}$-indene adduct. In some embodiments, the blend comprises about 10% [60]PCBM and about 90% $C_{70}$-indene adduct. In some embodiments, the blend comprises about 15% [60]PCBM and about 85% $C_{70}$-indene adduct.

In some embodiments, the blend comprises about 90% [60]PCBM and about 10%

In some embodiments, the blend comprises about 85% [60]PCBM and about 15%

In some embodiments, the blend comprises about 90% [60]PCBM and about 10%

In some embodiments, the blend comprises about 10% [60]PCBM and about 90%

In some embodiments, the blend comprises about 10% [60]PCBM and about 90%

In some embodiments, the blend comprises about 15% [60]PCBM and about 85%

In some embodiments, the blend comprises about 15% [60]PCBM and about 85%

In some embodiments, the blend comprises about 85% [60]PCBM and about 15%

Measuring Performance

Blends of two or more fullerene derivatives with suitable ratios may obtain power conversion efficiencies similar or beyond that of current state of the art OPV devices. Power conversion efficiency is a measure of the efficiency with which a device converts photons to electricity.

The stability of the device is determined by irradiating the device and measuring performance over time under light soaking conditions. Performance may be quantified based on PCE. The stability may be measured under various conditions, including temperature, humidity, and light intensity, depending on the conditions in which the device will operate. Stability may be determined either be measuring performance continuously or by measuring performance before and after a period of use.

Organic Photovoltaic Devices

Allowing for the use of inexpensive, high-speed, large-scale roll-to-roll manufacturing processes, organic photovoltaic devices (OPVs) have a significant chance of becoming important technology for electricity generation.

OPV devices, also called polymer-solar cells (PSC) or polymer-fullerene composite solar cells, are lightweight and can be flexible, opening the possibility for a range of new applications including large-area pliable devices.

Without wishing to be bound by theory, in addition to tuning the optical and electronic properties of the materials used for light harvesting, carrier generation, transport, and collection, control of the nanoscale morphology of the active layer is another important factor on the path to increasing power conversion efficiencies (PCE) in the laboratory and, particularly, of large-area devices. Particularly, nanoscale morphology may be an important factor in the optimization of OPV.

Bulk heterojunction OPVs are a particular class of OPV device, where a nanoscale morphology between an electron donor material (in most but not all cases a polymer) and electron accepting material is formed. OPV devices include in their active layer an electron donor (e.g., poly(3-hexylthiophene) (P3HT)) blended with electron acceptors, such as fullerenes or their derivatives. When blends of fullerene derivatives are combined with electron donor polymers, the morphology of the fullerene-polymer blend depends on the derivatives and ratio of the fullerene derivative blend. Also, the use of blends of electron-donor materials have been reported (e.g., Lin et al., Synthetic Metals 2014, 192, 113-118; herein incorporated by reference in its entirety.)

The devices can be made, e.g., via liquid deposition of different layers such as the electrode, electron transport layer, etc. The active layer comprises an electron acceptor and an electron donor.

Additional suitable electron donor materials include semiconducting polymers, such as poly(3-hexylthiophene), (poly [2-(3,7-dimethyloctyloxy)-5-methyloxy]-para-phenylene vinylene) (MDMO-PPV), carbazole-based copolymers, cyclopentadithiophene-based copolymers, diketopyrrolopyrrole (DPP)-based copolymers and small molecules including some liquid crystals (e.g., functionalized hexabenzoncoronene), pentacene derivatives, oligothiophenes, triphenylamines, functionalized anthradithiophenes and a number of traditional low molecular weight colorants, e.g., from the thiophene- and indoline series.

General Procedures for Preparation of Fullerenes

Into a vessel is added fullerene derivatives and, optionally, other compounds in specific proportions to make the desired blend. A solvent is added of type and volume suitable to dissolve the component materials of the blend, preferably completely. In some embodiments, optionally and without limitation, solubility can be aided by any combination of time, heat, sonication, stirring, rotation, agitation and/or use of excess solvent. In some embodiments, once the material is dissolved, preferably completely dissolved, some solvent may be optionally removed to achieve a desired concentration. In some embodiments, the solvated blend is then precipitated by some means, including but not limited to, further concentration and/or the addition of, or addition to an antisolvent. In some embodiments, it is desirable for the precipitation to be complete and uniform such that the ratio of component materials is about uniform and consistent throughout the product. In some embodiments, the precipitated material is then filtered, rinsed with the antisolvent and allowed to dry in any number, order or combination of steps using some combination of vacuum, heat and/or time. In some embodiments, techniques including, but not limited to, sieving may be used to achieve a desired appearance and/or consistency of the product. The dryness of the material can be confirmed by thermogravimetric analysis (TGA). The yield can be confirmed by mass once the material is dry. The ratio of components, purity, and level of consistency throughout the solid can be confirmed by various methods of characterization including high performance liquid chromatography (HPLC) analysis.

EXAMPLES

Certain embodiments will now be described in the following non-limiting examples.

Preparation of Blend I

Blend I was prepared using and

[60]PCBM mass equal to nine tenths of the total desired mass of the blend, and Diels-Alder adduct mass equal to one tenth of the total desired mass of the blend were added to a rotovap flask large enough to achieve 18 g/L total fullerenes in solvent. The flask was secured to the rotovap. O-xylene was added via injection line and negative pressure to achieve 18 g/L of solids in solvent. The contents were stirred at ~200 torr in a 50° C. water bath for 30-60 minutes until solids are completely dissolved. The pressure was reduced to evaporate o-xylene until the concentration was 100 g/L. It is preferred not to exceed 100 g/L. The fullerene solution in o-xylene was slowly poured into methanol to precipitate the fullerene adducts completely. The mixture was vacuum filtered through a 393 Sartorius grade filter paper (1-2 micron). The solids were rinsed with methanol to push all o-xylene through to the filtrate. The filtered solids were dried under vacuum, preferably for 12 or more hours at 70° C. The solids were removed from the oven, preferably at not more than 50° C., the solids were sieved, and the blend continued to dry for another or more hours at 50° C. and high vacuum. The solids were removed from the oven. The yield of solids obtained was quantitative. The purity and component ratio based on HPLC analysis were recorded and the solid was analyzed by TGA to determine the residual solvent content.

Preparation of Blend II

Blend II was prepared using and

[60]PCBM mass equal to nine tenths of the total desired mass of the blend, and Diels-Alder adduct mass equal to one tenth of the total desired mass of the blend were added to a rotovap flask large enough to achieve 18 g/L total fullerenes in solvent. The flask was secured to the rotovap. O-xylene was added via injection line and negative pressure to achieve 18 g/L of solids in solvent. The contents were stirred at ~200 torr in a 50° C. water bath for 30-60 minutes until solids are completely dissolved. The pressure was reduced to evaporate o-xylene until the concentration is 100 g/L. It is preferable not exceed 100 g/L. The fullerene solution in o-xylene was slowly poured into methanol to precipitate the fullerene adducts completely. The mixture was vacuum filtered through a 393 Sartorius grade filter paper (1-2 micron). The solids were rinsed with methanol to push all o-xylene through to the filtrate. The filtered solids were dried under vacuum, preferably for 12 or more hours at 70° C. The solids were removed from the oven, preferably at not more than 50° C., the solids were sieved, and the blend continued for another 12 or more hours at 50° C. and high vacuum. The solids were removed from the oven from the oven. The yield of solids obtained was quantitative. The purity and component ratio based on HPLC analysis was recorded and the solid was analyzed by TGA to determine the residual solvent content.

Figure 1:
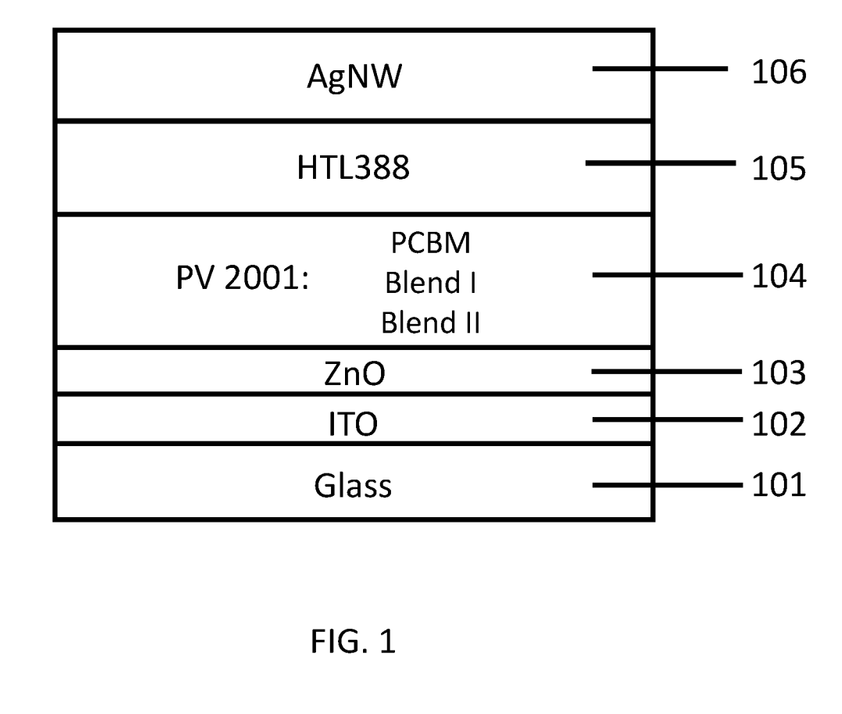
FIG. 1 is an exemplary schematic of device architecture of devices using PV2001 as donor material and [60]PCBM, Blend I or Blend II as acceptor material in the active layer.

Preparation of Devices Using Blend I or Blend II with the Donor PV2001 in the Active Layer Devices with PV2001 as the donor material and Blend I, Blend II, or [60]PCBM as the acceptor material were prepared using an inverted architecture as shown in FIG. 1. Glass substrates (101) (25 mm×25 mm, Standard-Layout, 0.1 cm², resulting in six solar cells on each substrate), precoated with indium tin oxide (ITO) (102), were precleaned by wiping with soft tissue and toluene. Subsequently, the glass substrates were further cleaned in an ultrasonic bath, first with acetone and then with IPA, for 5 min, respectively. A ZnO solution in IPA was deposited by doctor blading followed by 4 min annealing at 120° C. under air to form a ZnO oxide layer (103). The active layer (104) included PV2001 as a donor and [60]PCBM, Blend I, or Blend II as the acceptor. In preparation of the active layer ink, 13.5 mg of PV2001 (purchased from Raynergy Tek, Hsinchu, Taiwan) and 19.5 mg of [60]PCBM, Blend I or Blend II were dissolved, at a temperature of 120° C. and under stirring for at least 8 h under nitrogen, in 1 mL of o-xylene, resulting in an optical density of 0.7 to 0.8 measured at 670-675 nm by spectrophotometer, before deposition, by doctor blading, on the top of the ZnO oxide layer (103) under ambient conditions. Subsequently poly(3,4-ethylenedioxythiophene) polystyrene sulfonate (PEDOT-PSS, HTL 388) (105) was deposited as hole transport layer, again by doctor blading, followed by annealing for 4 min at 140° C. in a glove box. Finally, silver nanowires (106) were deposited as top electrode out of an aqueous solution.

Figure 2:
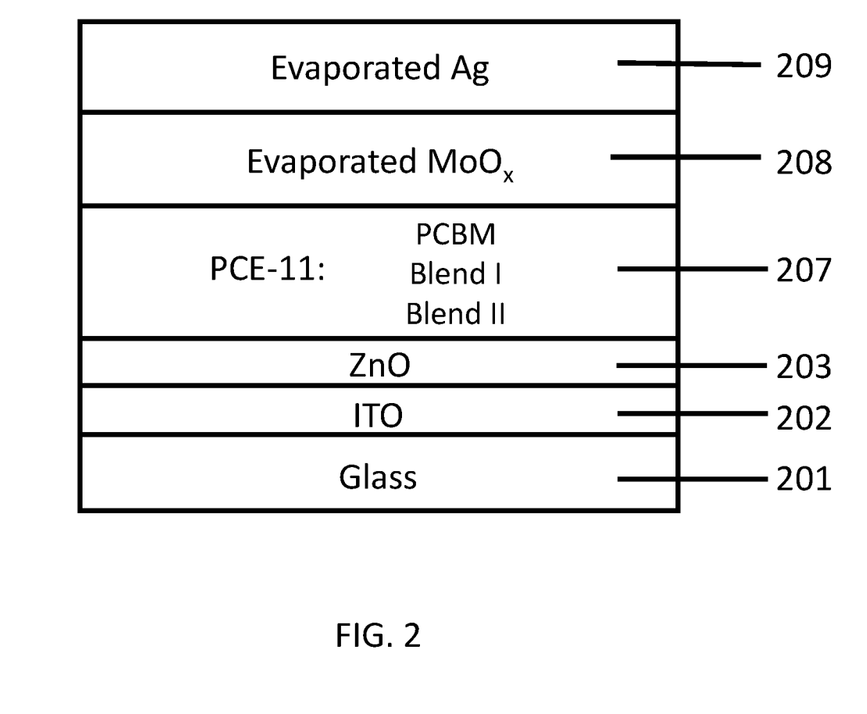
FIG. 2 is an exemplary schematic of device architecture of devices using PCE-11 as donor material and [60]PCBM, Blend I, or Blend II as acceptor material in the active layer.
Figures 3A, 3D:
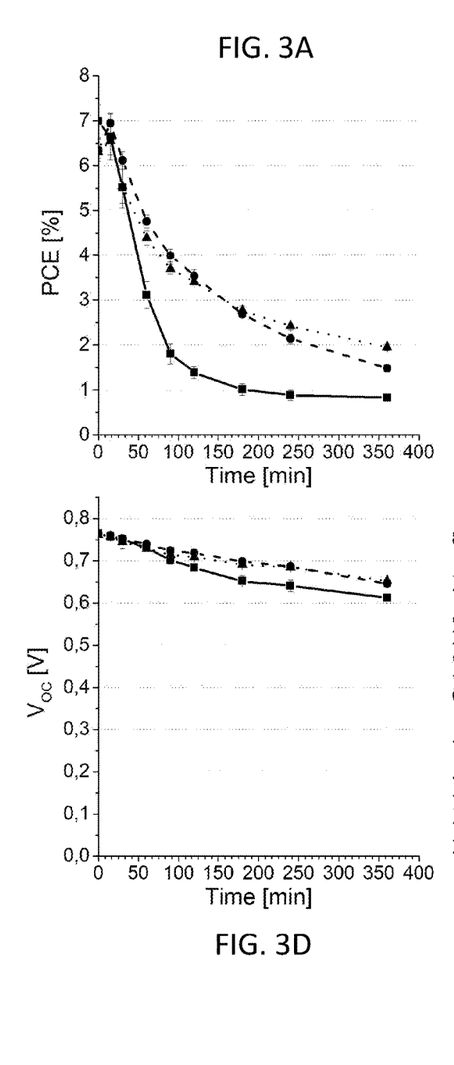
FIG. 3A is a graph of the power conversion efficiency (PCE, %) of ITO/ZnO/PV2001:acceptor/PEDOT:PSS/silver nanowire (AgNW) devices as a function of annealing time (in air at 120° C.) using [60]PCBM, Blend I, or Blend II as acceptor material.
FIG. 3D is a graph of the open circuit voltage ($V_{oc}$, V) of ITO/ZnO/PV2001:acceptor/PEDOT:PSS/silver nanowire (AgNW) devices as a function of annealing time (in air at 120° C.) using [60]PCBM, Blend I, or Blend II as acceptor material.
Figures 3B, 3E:
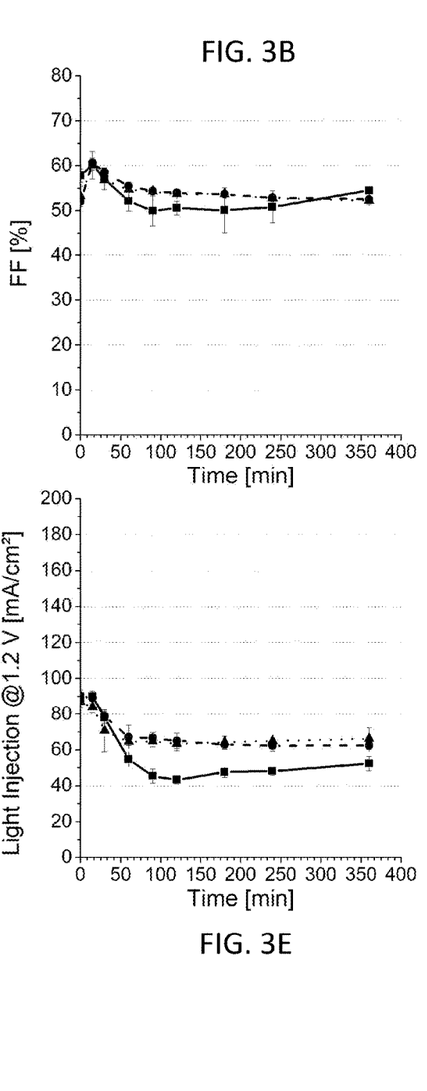
FIG. 3B is a graph of the fill factor (FF, %) of ITO/ZnO/PV2001:acceptor/PEDOT:PSS/silver nanowire (AgNW) devices as a function of annealing time (in air at 120° C.) using [60]PCBM, Blend I, or Blend II as acceptor material.
FIG. 3E is a graph of the light injection at 1.2 V (mA/cm$^2$) of ITO/ZnO/PV2001:acceptor/PEDOT:PSS/silver nanowire (AgNW) devices as a function of annealing time (in air at 120° C.) using [60]PCBM, Blend I, or Blend II as acceptor material.
Figure 3C:
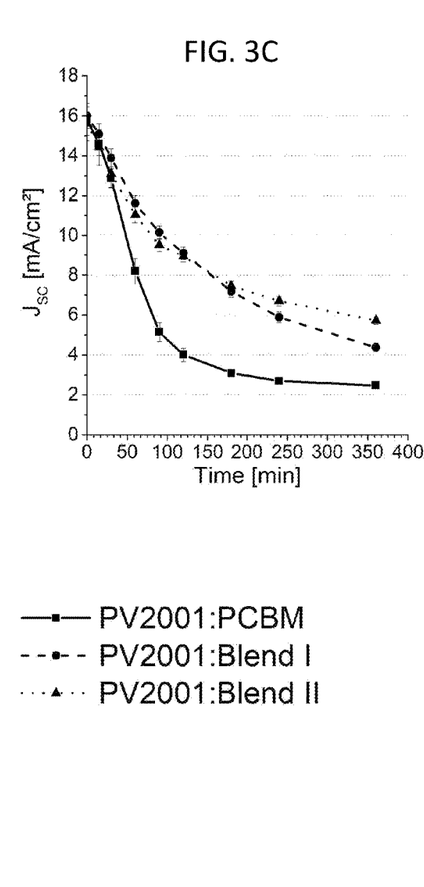
FIG. 3C is a graph of the short circuit current ($J_{sc}$, mA/cm$^2$) of ITO/ZnO/PV2001:acceptor/PEDOT:PSS/silver nanowire (AgNW) devices as a function of annealing time (in air at 120° C.) using [60]PCBM, Blend I, or Blend II as acceptor material.
Figure 4A:
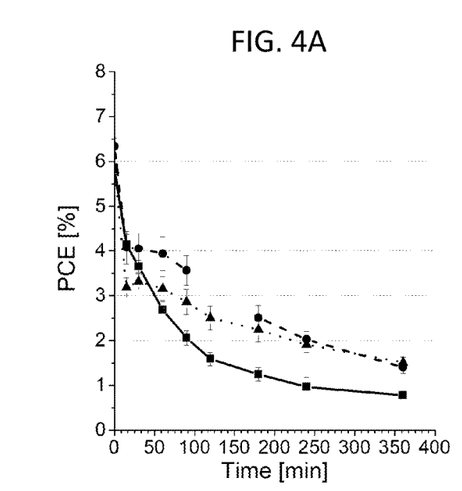
FIG. 4A is a graph of the power conversion efficiency (PCE, %) of ITO/ZnO/PCE-11:acceptor/evaporated MoO$_x$/evaporated silver (Ag) devices as a function of annealing time (in air at 120° C.) using [60]PCBM, Blend I, or Blend II as acceptor material.
Figure 4B:
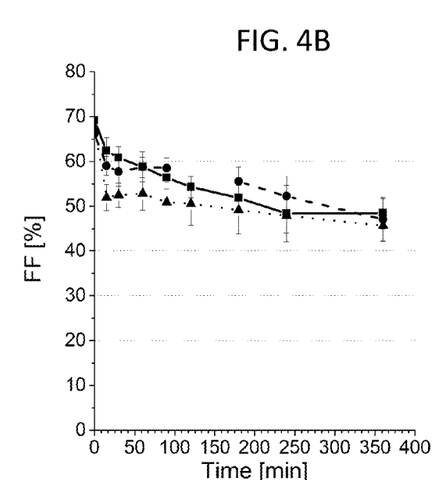
FIG. 4B is a graph of the fill factor (FF, %) of ITO/ZnO/PCE-11:acceptor/evaporated MoO$_x$/evaporated silver (Ag) devices as a function of annealing time (in air at 120° C.) using [60]PCBM, Blend I, or Blend II as acceptor material.
Figure 4C:
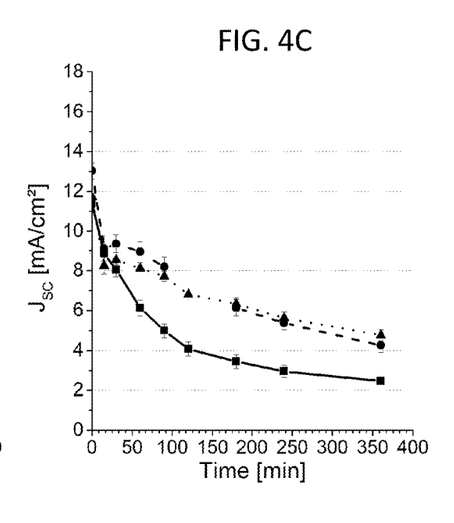
FIG. 4C is a graph of the short circuit current ($J_{sc}$, mA/cm$^2$) of ITO/ZnO/PCE-11:acceptor/evaporated MoO$_x$/evaporated silver (Ag) devices as a function of annealing time (in air at 120° C.) using [60]PCBM, Blend I, or Blend II as acceptor material.
Figure 4D:
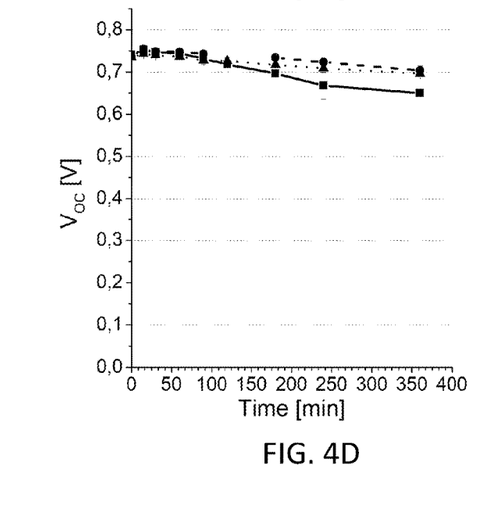
FIG. 4D is a graph of the open circuit voltage ($V_{oc}$, V) of ITO/ZnO/PCE-11:acceptor/evaporated MoO$_x$/evaporated silver (Ag) devices as a function of annealing time (in air at 120° C.) using [60]PCBM, Blend I, or Blend II as acceptor material.
Figure 4E:
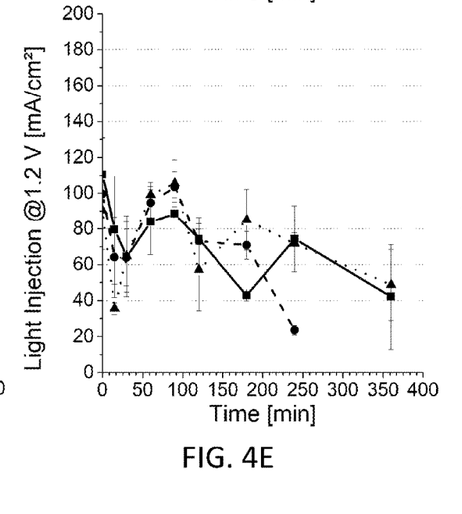
FIG. 4E is a graph of the light injection at 1.2 V (mA/cm$^2$) of ITO/ZnO/PCE-11:acceptor/evaporated MoO$_x$/evaporated silver (Ag) devices as a function of annealing time (in air at 120° C.) using [60]PCBM, Blend I, or Blend II as acceptor material.

Preparation of Devices Using Blend I or Blend II with the Donor PCE-11 in the Active Layer Devices with PCE-11 as the donor material and Blend I, Blend II, or [60]PCBM as the acceptor material were prepared using an inverted architecture as shown in FIG. 2. Glass substrates (201) (25 mm×25 mm, Standard-Layout, 0.1 cm², resulting in six solar cells on each substrate), precoated with indium tin oxide (ITO) (202), were pre-cleaned by wiping with soft tissue and toluene. Subsequently, the glass substrates were further cleaned in an ultrasonic bath, first with acetone and then with IPA, for 5 min, respectively. A ZnO solution was deposited by doctor blading followed by 4 min annealing at 120° C. under air to form a ZnO oxide layer. The active layer (207) includes PCE-11 as a donor and [60]PCBM, Blend I, or Blend II as the acceptor. In preparation of the active layer ink, 13.5 mg of PCE-11 (PffBT4T-2OD, purchased from 1-Material Inc, Dorval, Quebec, Canada) and 19.5 mg of [60]PCBM, Blend I or Blend II were dissolved, at a temperature of 120° C. and under stirring for at least 8 h under nitrogen, in 1 mL of o-xylene, resulting in an optical density of 0.7 to 0.8 measured at 687 nm by spectrophotometer, before deposition, by doctor blading, on the top of the ZnO oxide layer (203) under ambient conditions. Subsequently, 10 nm of MoO$_x$ (208) was deposited by evaporation as hole transport layer. Finally, 100 nm of silver (209) was deposited as top electrode by evaporation.

Stability Measurement

The thermal stability of the devices with both PV 2001 or PCE-11 in the active layer was assessed by thermooxidation at 120° C. in ambient air, without light. For this purpose, the finalized cells have been measured in nitrogen at 1 sun. Subsequently, cells have been annealed in air at 120° C. in a dark atmosphere. The performance of the cells was measured regularly as a function of the annealing time. For this purpose, a solar simulator (LOT Quantum Design LS0916) and a source measurement unit KEYSIGHT B2901A were used. After each measurement the cells were put back in the oven to continue the annealing procedure. A potential from −1 to 1.5 V was applied to the device while the device was irradiated and the current measured. The power conversion efficiency, fill factor, short circuit current, open circuit voltage, and light injection data were extracted from the resulting current-voltage (I-V) curve. Power conversion efficiency (PCE, %), fill factor (FF, %), short circuit current ($J_{sc}$, mA/cm²), open circuit voltage ($V_{oc}$, V), and light injection at 1.2 V (mA/cm²) of the devices using PV2001 as donor material are shown in FIGS. 3A-3E, while the corresponding data from the devices using PCE-11 as donor material are given in FIGS. 4A-4E.

An increased thermal stability of Blends I and II, in comparison to the use of [60]PCBM, has been observed for both investigated donor materials, PV 2001 and PCE-11. The decrease of performance over time observed for all materials systems investigated here, but significantly less pronounced using Blend I or Blend II, has been mainly driven by the decrease of the short circuit current (J), shown in FIG. 3C and FIG. 4C. Such improved thermal stability is of significant commercial relevance, particularly in application where an annealing process step of limited duration, for instance, in the context of device integration is required.

Figure 5:
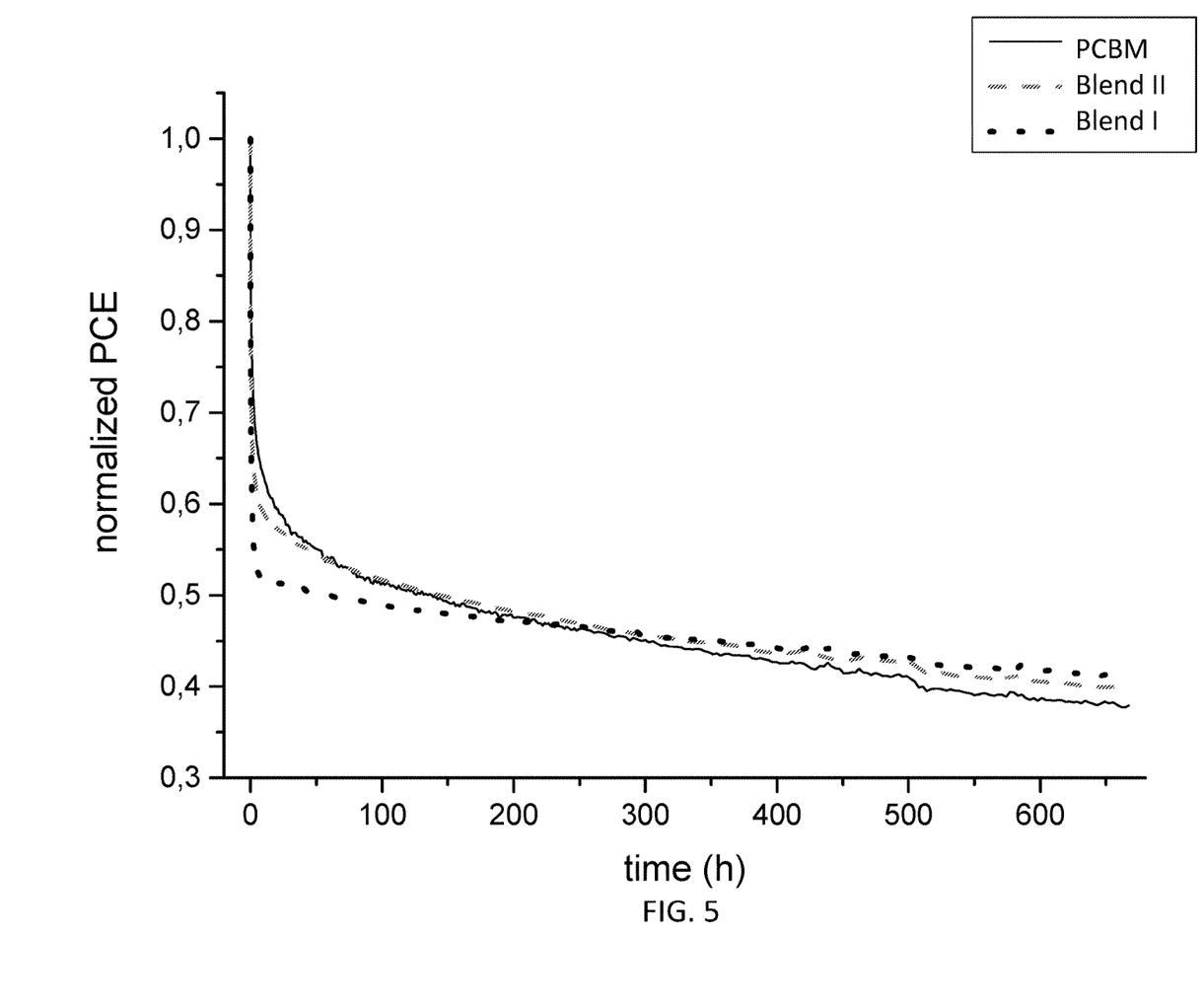
FIG. 5 is a graph of the Normalized Power Conversion Efficiency (PCE) over time of PCE-11 with the three acceptor materials [60]PCBM, Blend I and Blend II under constant illumination with 1 sun LED light at 65° C. and under short circuit condition.

Furthermore, lifetime measurements were conducted under LED-light exposure approximating solar light (without UV) at an intensity of 1 sun under inert gas and a controlled temperature of 65° C. The evolution of the power conversion efficiency (PCE), normalized to initial measurements, for [60[PCBM, Blend I and Blend II, using PCE-11 as donor material, is shown in FIG. 5 over a duration of 650 h. Both Blend I and Blend II showed evidence of enhanced long-term stability in comparison to [60]PCBM as acceptor material. The continuation of the light-exposure is expected to show even more accentuated differences.

As will be apparent to one of ordinary skill in the art from a reading of this disclosure, further embodiments of the present invention can be presented in forms other than those specifically disclosed above. The particular embodiments described above are, therefore, to be considered as illustrative and not restrictive. Those skilled in the art will recognize, or be able to ascertain, using no more than routine experimentation, numerous equivalents to the specific embodiments described herein. Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways within the scope and spirit of the invention. The scope of the invention is as set forth in the appended claims and equivalents thereof, rather than being limited to the examples contained in the foregoing description.

What is claimed is:

1. A composition comprising
a first fullerene derivative of formula:

wherein A is a fullerene, X is an aryl group, Y is an alkyl group, and n is an integer between 1 and 6; and
a second fullerene derivative comprising a Diels-Alder adduct;
and
wherein the ratio of the first fullerene derivative to the second fullerene derivative is between about 97:3 and about 70:30.

2. The composition of claim 1, wherein the first fullerene derivative is a $C_{60}$-based fullerene derivative and the second fullerene derivative is a $C_{70}$-based fullerene derivative.

3. The composition of claim 1, wherein the first fullerene derivative is a $C_{70}$-based fullerene derivative and the second fullerene derivative is a $C_{60}$-based fullerene derivative.

4. The composition of claim 1, wherein the first fullerene derivative and the second fullerene derivative are $C_{60}$-based fullerene derivatives.

5. The composition of claim 1, wherein the first fullerene derivative and the second fullerene derivative are $C_{70}$-based fullerene derivatives.

6. The composition of claim 1, wherein the ratio of the first fullerene derivative and the second fullerene derivative is between about 97:3 and about 70:30.

7. The composition of claim 1, wherein the ratio of the first fullerene derivative and the second fullerene derivative is between about 95:5 and about 70:30.

8. The composition of claim 1, wherein the ratio of the first fullerene derivative and the second fullerene derivative is between about 92:8 and about 70:30.

9. The composition of claim 1, wherein the ratio of the first fullerene derivative and the second fullerene derivative is between about 97:3 and about 75:25.

10. The composition of claim 1, wherein the ratio of the first fullerene derivative and the second fullerene derivative is about 95:5.

11. The composition of claim 1, wherein the ratio of the first fullerene derivative and the second fullerene derivative is about 90:10.

12. The composition of claim 1, further comprising a third fullerene derivative.

13. The composition of claim 1, further comprising a non-fullerene acceptor.

14. The composition of claim 1, further comprising a quantum dot.

15. The composition of claim 1, wherein the first fullerene derivative comprises a methanofullerene selected from the group consisting of phenyl-$C_{61}$-butyric-acid-methyl-ester ([60]PCBM), thiophenyl-$C_{61}$-butyric-acid-methyl-ester ([60]ThCBM), [70]PCBM, phenyl-$C_{61}$-butyric-acid-hexyl-ester ([60]PCBC$_6$), phenyl-$C_{71}$-butyric-acid-hexyl-ester ([70]PCBC$_6$) and other [6,6]-phenyl $C_{61}$ butyric acid or [6,6]-phenyl $C_{71}$ butyric acid derivatives.

16. The composition of claim 1, wherein the second fullerene derivative comprises a Diels-Alder adduct selected from the group consisting of optionally substituted indene, α-substituted o-quinodimethane, and esters of 3-(1-indenyl) propionic acid.

17. The composition of claim 1, wherein the first fullerene derivative is [60]PCBM or [70]PCBM, and the second fullerene derivative is an optionally substituted Diels-Alder indene-adduct, α-substituted o-quinodimethane-adduct, or ester of 3-(1-indenyl) propionic acid.

18. The composition of claim 1, wherein the first fullerene derivative is [60]PCBM, and the second fullerene derivative is or 19. The composition of claim 1, further comprising a semiconducting polymer.

20. The composition of claim 19, wherein the semiconducting polymer is selected from the group consisting of poly(3-hexylthiophene), (poly[2-(3,7-dimethyloctyloxy)-5-methyloxy]-para-phenylene vinylene) (MDMO-PPV), carbazole-based copolymers, diketopyrrolopyrrole (DPP)-based copolymers, cyclopentadithiophene-based copolymers, and small molecules including some liquid crystals, pentacene derivatives, oligothiophenes, triphenylamines, functionalized anthradithiophenes and a number of traditional low molecular weight colorants.

21. The composition of claim 1, wherein n is 1 or 2.

22. An OPV device comprising the composition of claim 1.

23. The OPV device of claim 22, wherein the device has increased thermal stability relative to OPV devices that are not comprised of two fullerene derivatives.

24. The OPV device of claim 22, wherein the device has increased thermal stability when heated under air to 120° C. relative to OPV devices that are not comprised of two fullerene derivatives.

25. The OPV device of claim 22, wherein the device has increased stability when submitted to irradiation of 1 sun intensity relative OPV devices that are not comprised of two fullerene derivatives.

* * * * *